United States Patent
Strauss et al.

(10) Patent No.: US 9,412,466 B2
(45) Date of Patent: *Aug. 9, 2016

(54) APPROXIMATE MULTI-LEVEL CELL MEMORY OPERATIONS

(71) Applicant: MICROSOFT TECHNOLOGY LICENSING, LLC, Redmond, WA (US)

(72) Inventors: Karin Strauss, Seattle, WA (US); Douglas C. Burger, Bellevue, WA (US); Luis Henrique Ceze, Seattle, WA (US); Adrian Sampson, Seattle, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/496,692

(22) Filed: Sep. 25, 2014

(65) Prior Publication Data

US 2015/0009736 A1    Jan. 8, 2015

Related U.S. Application Data

(63) Continuation of application No. 13/794,740, filed on Mar. 11, 2013, now Pat. No. 8,861,270.

(51) Int. Cl.
| | |
|---|---|
| *G11C 16/06* | (2006.01) |
| *G11C 27/00* | (2006.01) |
| *G06F 12/02* | (2006.01) |
| *G11C 11/56* | (2006.01) |
| *G11C 16/34* | (2006.01) |
| *G11C 13/00* | (2006.01) |

(52) U.S. Cl.
CPC .......... *G11C 27/005* (2013.01); *G06F 12/0246* (2013.01); *G11C 11/5628* (2013.01); *G11C 11/5678* (2013.01); *G11C 13/0004* (2013.01); *G11C 13/004* (2013.01);

(Continued)

(58) Field of Classification Search
CPC ................... G11C 11/5628; G11C 11/5642
USPC .................................................. 365/185.03
See application file for complete search history.

(56) References Cited

U.S. PATENT DOCUMENTS

| | | | |
|---|---|---|---|
| 6,301,161 B1 | 10/2001 | Holzmann et al. | |
| 7,656,710 B1 | 2/2010 | Wong | |

(Continued)

OTHER PUBLICATIONS

"International Preliminary Report on Patentability Issued in PCT Patent Application No. PCT/US2014/020056", Mailed Date: Jun. 15, 2015, (7 Pages total).

(Continued)

*Primary Examiner* — Huan Hoang
(74) *Attorney, Agent, or Firm* — Gregg Wisdom; Judy Yee; Micky Minhas

(57) ABSTRACT

The present technology relaxes the precision (or full data-correctness-guarantees) requirements in memory operations, such as writing or reading, of MLC memories so that an application may write and read a digital data value as an approximate value. Types of MLCs include Flash MLC and MLC Phase Change Memory (PCM) as well as other resistive technologies. Many software applications may not need the accuracy or precision typically used to store and read data values. For example, an application may render an image on a relatively low resolution display and may not need an accurate data value for each pixel. By relaxing the precision or correctness requirements is a memory operation, MLC memories may have increased performance, lifetime, density, and/or energy efficiency.

20 Claims, 10 Drawing Sheets

(52) U.S. Cl.
CPC .......... *G11C 13/0069* (2013.01); *G11C 16/06* (2013.01); *G11C 16/3495* (2013.01)

(56) References Cited

U.S. PATENT DOCUMENTS

| | | | |
|---|---|---|---|
| 7,802,132 | B2 | 9/2010 | Annavajjhala et al. |
| 8,310,870 | B2 | 11/2012 | Dutta et al. |
| 2006/0215800 | A1 | 9/2006 | Pohl |
| 2008/0155380 | A1 | 6/2008 | Guterman et al. |
| 2008/0158950 | A1 | 7/2008 | Aritome |
| 2008/0215800 | A1 | 9/2008 | Lee et al. |
| 2009/0296466 | A1 | 12/2009 | Kim et al. |
| 2011/0161571 | A1 | 6/2011 | Kim et al. |
| 2011/0225472 | A1* | 9/2011 | Sommer ............ G06F 11/1068 714/719 |
| 2012/0218814 | A1 | 8/2012 | Bivens et al. |

OTHER PUBLICATIONS

Munishwar, et al., "File System Support for Adjustable Resolution Applications in Sensor Networks", Retrieved on: Nov. 1, 2012, Available at: http://users.sdsc.edu/~sameer/pubs/ros.pdf (14 pages total).

Smullen, et al., "Relaxing Non-Volatility for Fast and Energy-Efficient STT-RAM Caches", In Proceedings of IEEE 17th International Symposium on High Performance Computer Architecture, Feb. 12, 2011 (12 pages total).

Zhang, et al., "Helmet: A Resistance Drift Resilient Architecture for Multi-level Cell Phase Change Memory System", In Proceedings of IEEE/IFIP 41st International Conference on Dependable Systems & Networks, Jun. 27, 2011 (12 pages total).

Nelson, et al., "Dense Approximate Storage in Phase-Change Memory", Retrieved on: Nov. 1, 2012, Available at: http://asplos11.cs.ucr.edu/selected_submissions/phase-change-memory.pdf (2 pages total).

Li, et al., "Improving Multi-Level NAND Flash Memory Storage Reliability Using Concatenated BCH-TCM Coding", In Proceedings of IEEE Transactions on Very Large Scale Integration Systems, Oct. 2010 (8 pages total).

"International Search Report & Written Opinion for PCT Patent Application No. PCT/US2014/020056", Mailed Date: Jul. 25, 2014, Filed Date: Mar. 4, 2014, (11 pages total).

Soojun, et al., "Storage Architecture and Software Support for SLC/MLC Combined Flash Memory", In Proceedings of the ACM symposium on Applied Computing, Mar. 8, 2009, pp. 1664-1669. (6 pages total).

* cited by examiner

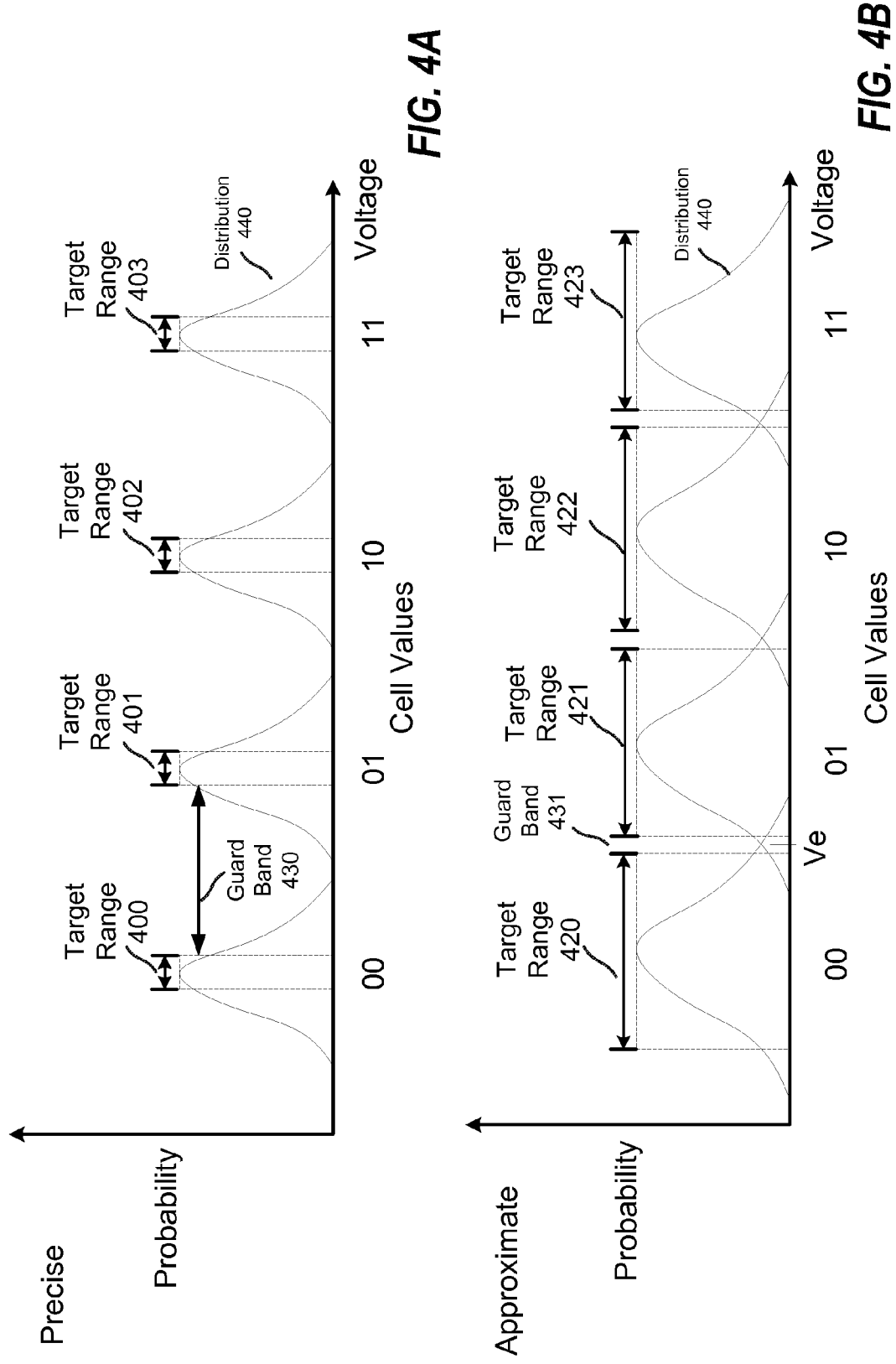

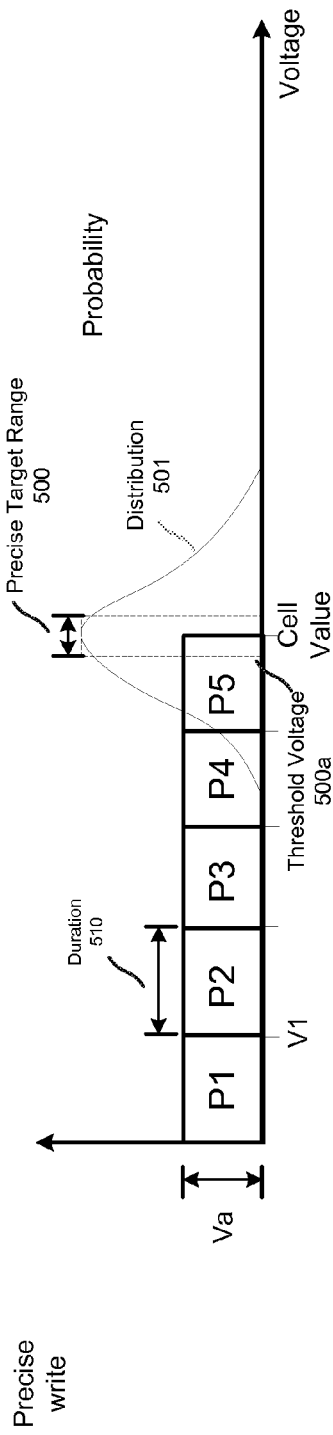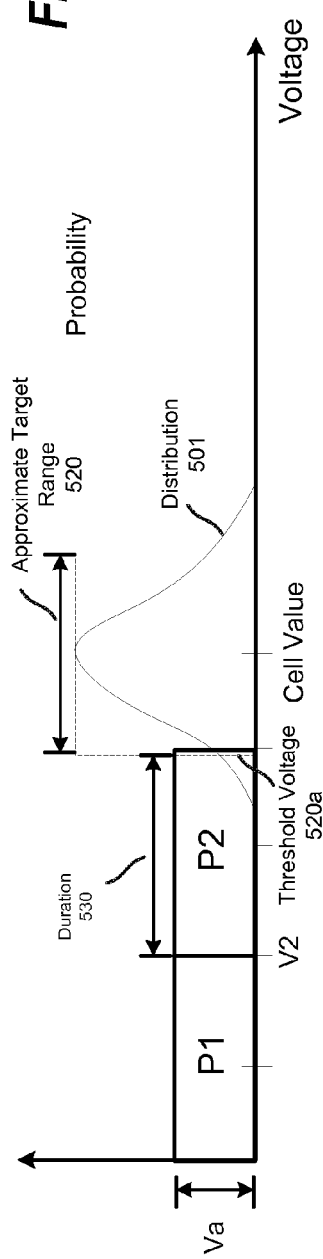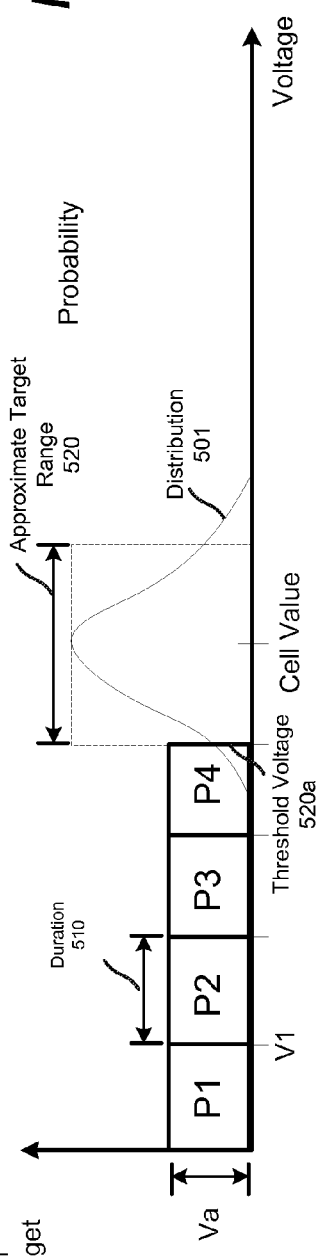

APPROXIMATE MULTI-LEVEL CELL MEMORY OPERATIONS

STATEMENT OF RELATED APPLICATION

This application is a continuation of U.S. application Ser. No. 13/794,740 filed Mar. 11, 2013, entitled, "APPROXIMATE MULTI-LEVEL CELL MEMORY OPERATIONS", now U.S. Pat. No. 8,861,270 issued Oct. 14, 2014, which is incorporated herein by reference in its entirety.

BACKGROUND

A multi-level cell (MLC) is a memory element capable of storing more than a single bit of information. MLC memories, such as MLC Flash and MLC Phase Change Memory (PCM), are typically read and written in an iterative manner. PCM is also known as PCME, PRAM, PCRAM, Ovonic Unified Memory, Chalcogenide RAM and C-RAM. A programming step is typically followed by a verify step that verifies the intended value is stored at a particular address.

For example, MLC NAND Flash memory is a MLC Flash technology using multiple levels per cell to allow a plurality of bits to be stored using the same number of transistors. A typical MLC NAND Flash memory has four possible states or values per cell, so the cell can store two bits of information.

MLC PCM memory is a type of non-volatile memory that uses a semiconductor alloy having two states, crystalline and amorphous. The amount of material in each state changes the resistance of the MLC PCM memory cell. MLC PCM memory stores each binary bit using the various electrical resistances of the semiconductor alloy to program the various cell values. The phase, and thus resistance value, for each bit vale is controlled by applying a voltage to an address so that current may change the phase and represented value.

SUMMARY

The present technology relaxes the precision (or full data-correctness-guarantees) requirements in memory operations, such as writing or reading, of MLC memories so that an application may write and read a digital data value as an approximate value. Types of MLC memories include Flash MLC and MLC Phase Change Memory (PCM) as well as other resistive technologies. Many software applications may not need the accuracy or precision typically used to store and read data values. For example, an application may render an image on a relatively low color range display and may not need an accurate data value for each pixel. Other types of data that may tolerate errors include audio data, video data, machine learning data and/or sensor data. By relaxing the precision or correctness requirements of a memory operation, MLC memories may have increased performance (reduced latency), lifetime (increased number or writes or reads before failure), density, and/or energy efficiency in embodiments.

Typically, each digital value in a MLC memory cell is identified by determining whether a sensed analog signal from the MLC cell falls within a range of analog values (voltage or charge in Flash MLC and resistance in PCM). When a write circuit attempts to store a digital data value in a MLC memory cell, the write circuit attempts to store an analog value that is very close to a middle point of a range of analog values that will correspond to the digital data value or within a target range of analog values. Similarly, when a read circuit attempts to read a digital data value in a MLC memory cell, the read circuit attempts to read an analog value that is very close to the middle point of the a range of analog values that will correspond to the digital data value or within a target range of analog values.

When writing (or reading) a digital value as an approximate value to a MLC memory, the target range of analog values for a MLC memory is increased such that the written analog value may fall in a range of likely values for the MLC memory as well as a range of likely values for an adjacent MLC memory that may lead to a erroneously written value.

In an embodiment, a precision requirement is relaxed by reducing the number of iterations used in writing to or reading from a MLC memory. Write operations are made faster by increasing an amount by which the value of a cell in the MLC memory is changed on each write iteration. An amount of energy, or a predetermined analog value, such as a predetermined amount of voltage or current, used to write a digital value in a MLC memory during an iteration may be increased. The increased predetermined analog value may be an increased programming pulse having a large value and/or duration. The increased predetermined analog write value reduces the number of iterations needed before a signal representing the digital data value is sensed between a target range of values. The signal representing the digital data value may reach the target range of values with less iteration, but less iteration may also increase the probability of error. Energy and wear on the MLC memory may be reduced by widening the range of the predetermined analog value used in writing to a MLC memory.

In another embodiment, a signal representing the digital value is not sensed after programming and predetermined numbers of programming pulses are applied without any sensing or verification step.

In another embodiment, a write operation to a MLC memory is made faster and with lower energy requirements by reducing the number of iterations in the write operation such that an analog signal that is used to write operation is in the outer distribution of likely analog value used to store the digital value. In other words, a larger target range of likely analog values is used and an analog value (or threshold value) at the beginning of the target range is used as compared to writing a data value as a precision value. Wear on the MLC memory may be reduced in this embodiment.

In another embodiment, a read operation consumes less energy by completing enough iteration to determine a rough vicinity of the analog value being read. Similar to a write operation, a larger target range of likely analog values is used and analog values at the beginning of the larger target range is used to identify that the read analog value corresponds to a particular digital value. Memory latency may be improved and wear may be improved when a read operation affects wear. Where read operations to one cell may disturb the value of other nearby cells, fewer read iterations may also reduce the probability of disturbing the values of nearby cells in an embodiment.

In another embodiment, a probabilistic determination following a pre-profiled distribution is made on a read analog signal that may represent one of two values with predetermined distributions. In an embodiment, a particular digital value is provided according to the relative density of each probability distribution.

A method embodiment stores an approximate value in a multi-level memory cell. A first signal is received that represents a first digital value to be stored in the multi-level cell. A first signal is also received that indicates the first digital value is to be written as the approximate value in the multi-level cell. At least one programming pulse is provided to the multi-level cell until a first sensed analog value from the multi-level cell is within a first range of values. A second signal is received that represents a second digital value to be stored in the multi-level cell. A second signal is received that indicates the second digital value is to be written as a precise value in the multi-level cell. At least one programming pulse is provided to the multi-level cell until a second sensed analog value from the multi-level cell is within a second range of values. The first range of values is wider than a second range of values.

An apparatus embodiment includes at least one controller to provide a signal representing a digital data value and a signal that indicates whether the digital data value is to be stored as an approximate value to at least one multi-level cell memory. The multi-level cell memory includes an interface to receive the signal representing the digital data value and the signal that indicates whether the digital data value is to be stored as the approximate value. A write circuit provides a first plurality of predetermined values to the multi-level cell so a first analog value is stored in the multi-level cell that is in a first range of analog values that represents the digital data value when the signal indicates the data value is to be stored as the approximate value. The write circuit provides a second plurality of predetermined values to the multi-level cell so a second analog value is stored in the multi-level cell that represents the digital data value that is in a second range of analog values when the signal indicates the data is to not be stored as the approximate value. The first range of analog values is wider than the second range of analog values.

In another embodiment, at least one processor readable memory has processor readable instructions encoded thereon. The instructions when executed by the at least one processor performs a method to read an approximate value and a precise value in an array of multi-level memory cells. The method includes outputting control information to read the precise value at a first multi-level cell in the array of multi-level cells. A first digital value corresponding to the precise value is received from the first multi-level cell. The first digital value was obtained by determining whether an analog value from the first multi-level cell was between a first range of analog values. Control information to read the approximate value from the first multi-level cell in the array of multi-level cells is also outputted. A second digital value corresponding to the approximate value is received. The second digital value was obtained by determining whether an analog signal from the first multi-level cell was between a second range of analog values. The second range of analog values is wider than the first range of analog values.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 4A-4B illustrates probabilities and target ranges of analog values associated with storing and reading data as precise data and approximate data.

FIGS. 5A-C conceptually illustrate writing or reading a data value stored as approximate data and precise data.

DETAILED DESCRIPTION

The present technology relaxes the precision requirements in memory operations, such as writing or reading, of multi-level cell (MLC) memory so that an application may store and read a digital data value as an approximate value. The number of iterations used to write or read from a MLC memory is reduced by expanding the target range of corresponding analog values that may introduce errors. The amount by which a value of a MLC memory is changed during a write iteration may also be increased which may also reduce the number of write iterations. A probabilistic determination may also be made on a read analog signal that may represent one of a set of values. By relaxing the precision or full data-correctness-guarantees of a memory operation, MLC memories may have increased performance, lifetime, density, and/or energy efficiency.

Memory operations, such as writing or reading, typically require full data-correctness-guarantees (e.g., precision). Memory operations with full data-correctness-guarantees refer to completing a memory operation such that all, or substantially all, bits of the data are correctly written or read. However, having memory operations with full data-correctness-guarantees, on a full-time basis, is often not practical for many computing devices. Hardware (e.g., a memory having multi-level cells) typically provides strong guarantees for error correction. Software typically relies on the memory device to maintain full data error-correction guarantees. Such reliance on a memory is demanding on the associated memory circuits and software. The demand may lead to memory that operate more slowly and consumes more energy. Perhaps worse, the memory may also experience shorter life spans. For example, precise MLC Flash memory operations may cause quicker wear out due to the need for a larger number of write iterations.

Full data-correctness-guarantees (e.g., precision memory operations with an effort to maintain the precision of all bits of data), which are often required by memory, are not always needed for software applications. Some software applications can tolerate errors in some of their data structures, such as, for example, picture data, audio data, video data, sensor data and/or most other data that a user decides to store. A computing device can process these types of data by storing the digital data as an approximate value and, at the same time, maintain virtually no perceptible difference in a user experience during the processing of the data. Alternatively, applications may need to store data precisely (having full data-correctness-guarantees) when an error in the data would not be desired. A computing device can process these types of data by storing and reading digital data as a precise value having full data-correctness guarantees during memory operations.

Figure 1:
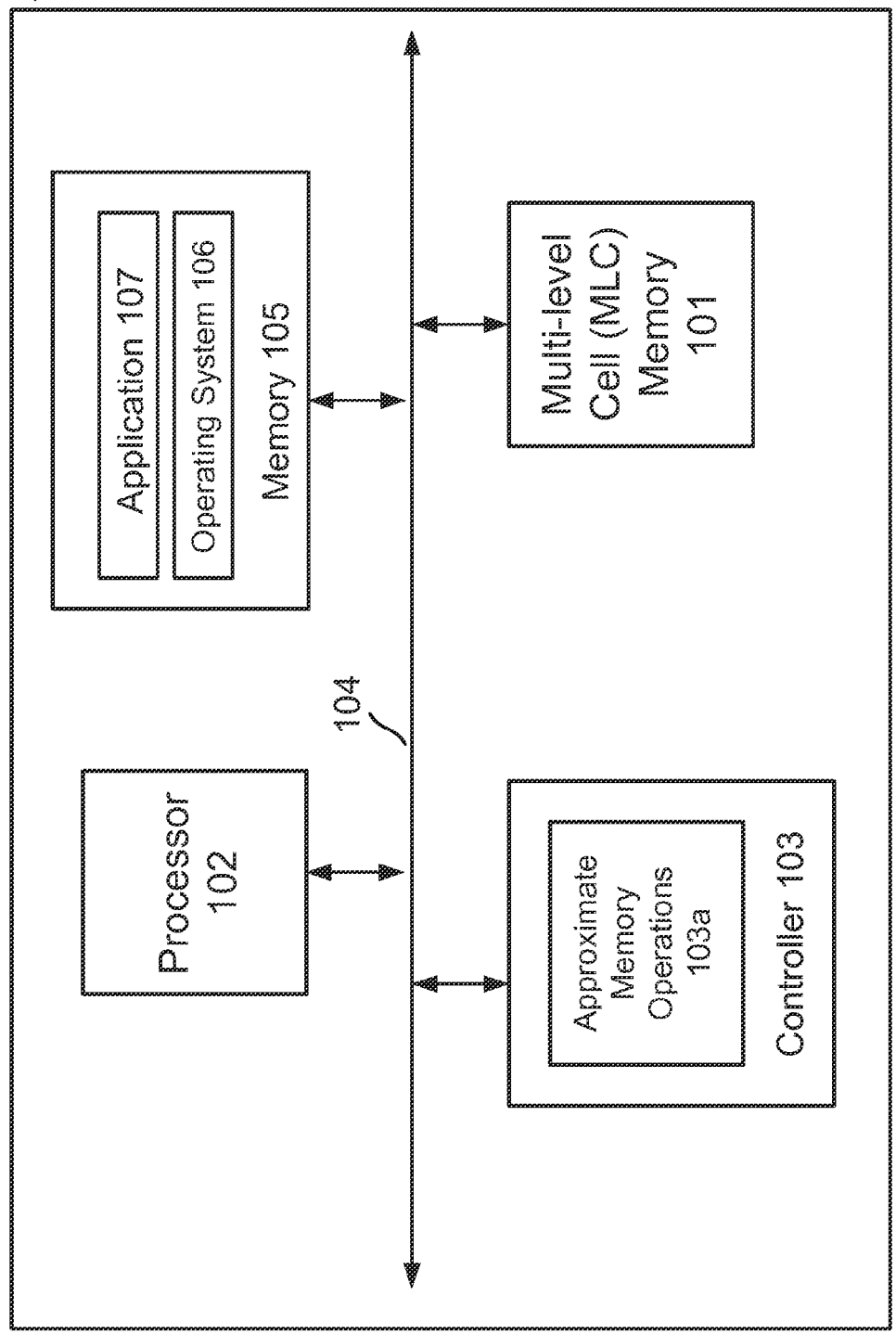
FIG. 1 is a high-level block diagram of a computing device providing approximate memory operations to a MLC memory.

FIG. 1 is a high-level block diagram of a computing device 100 that writes and reads a digital value as an approximate value to and from a MLC memory 101. In an alternate embodiment, computing device 100 also writes and reads a digital data as a precise value to and from a MLC memory 101. In an embodiment, computing device 100 includes processor 102, controller 103, memory 105 and MLC memory 101 that communicate by way of signal path 104 in an embodiment. Application 107 and operating system 106 is stored in memory 105. In an alternate embodiment, application 107 and operating system 106 may be stored in MLC memory 101. In an alternate embodiment, the function of controller 103, along with approximate memory operations 103a, may be performed by processor 102.

Figure 7:
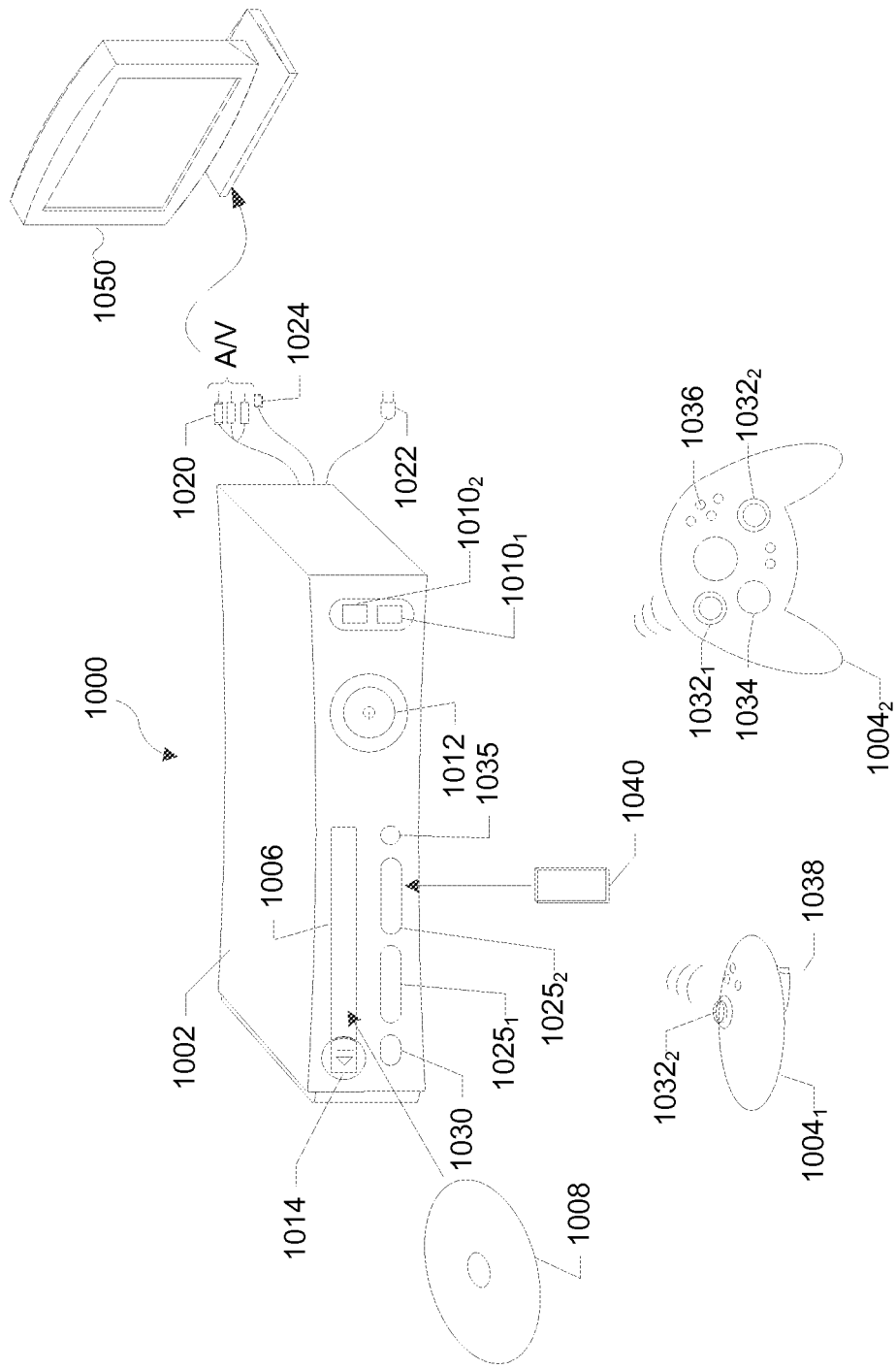
FIG. 7 is an isometric view of an exemplary gaming and media system.
Figure 8:
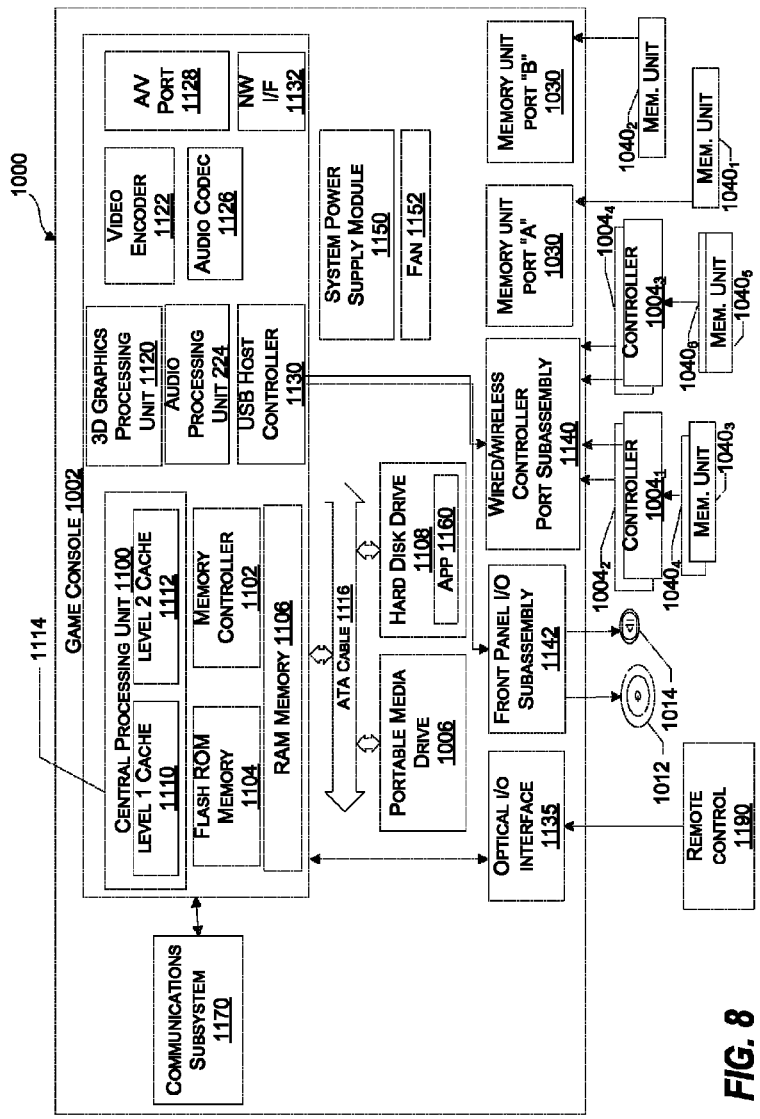
FIG. 8 is an exemplary functional block diagram of components of the gaming and media system.

In an embodiment, computing device 100 is included in a video game console and/or media console and illustrated in FIGS. 7 and 8. In alternate embodiments, computing device 100 may be included in at least a cell phone, mobile device, embedded system, media console, laptop computer, desktop computer, server and/or datacenter. In embodiments, computing device 100 corresponds to computing device 1800 having particular hardware components illustrated in FIG. 9 and as described herein.

In embodiments, computing device 100 is coupled to at least one network. In an embodiment, a network may be the Internet, a Wide Area Network (WAN) or a Local Area Network (LAN), singly or in combination. A network may transfer signals by wire or wirelessly, singly or in combination.

Processor 102 may also include a controller, central processing unit (CPU), GPU, digital signal processor (DSP) and/or a field programmable gate array (FPGA).

In embodiments, signal path 104 (as well as other signal paths described herein) are media that transfers a signal, such as an interconnect, conducting element, contact, pin, region in a semiconductor substrate, wire, metal trace/signal line, or photoelectric conductor, singly or in combination. In an embodiment, multiple signal paths may replace a single signal path illustrated in the figures and a single signal path may replace multiple signal paths illustrated in the figures. In embodiments, a signal path may include a bus and/or point-to-point connection. In an embodiment, a signal path includes control and data signal lines to carry control and data information as well as timing information. In an alternate embodiment, a signal path includes data signal lines or control signal lines. In still other embodiments, signal paths are unidirectional (signals that travel in one direction) or bidirectional (signals that travel in two directions) or combinations of both unidirectional signal lines and bidirectional signal lines.

In embodiments, processor 102 includes at least one processor that executes (or reads) processor (or machine) readable instructions, such an operating system 106 and/or application 107. In an embodiment, operating system 106 and application 107 may include one or more software components.

In an embodiment, a software component may include processor/machine readable instructions when executed by one or more processors perform one or more functions. In an embodiment, a software component may include a software program, software object, software function, software subroutine, software method, software instance, script or a code fragment, singly or in combination.

Figure 3:
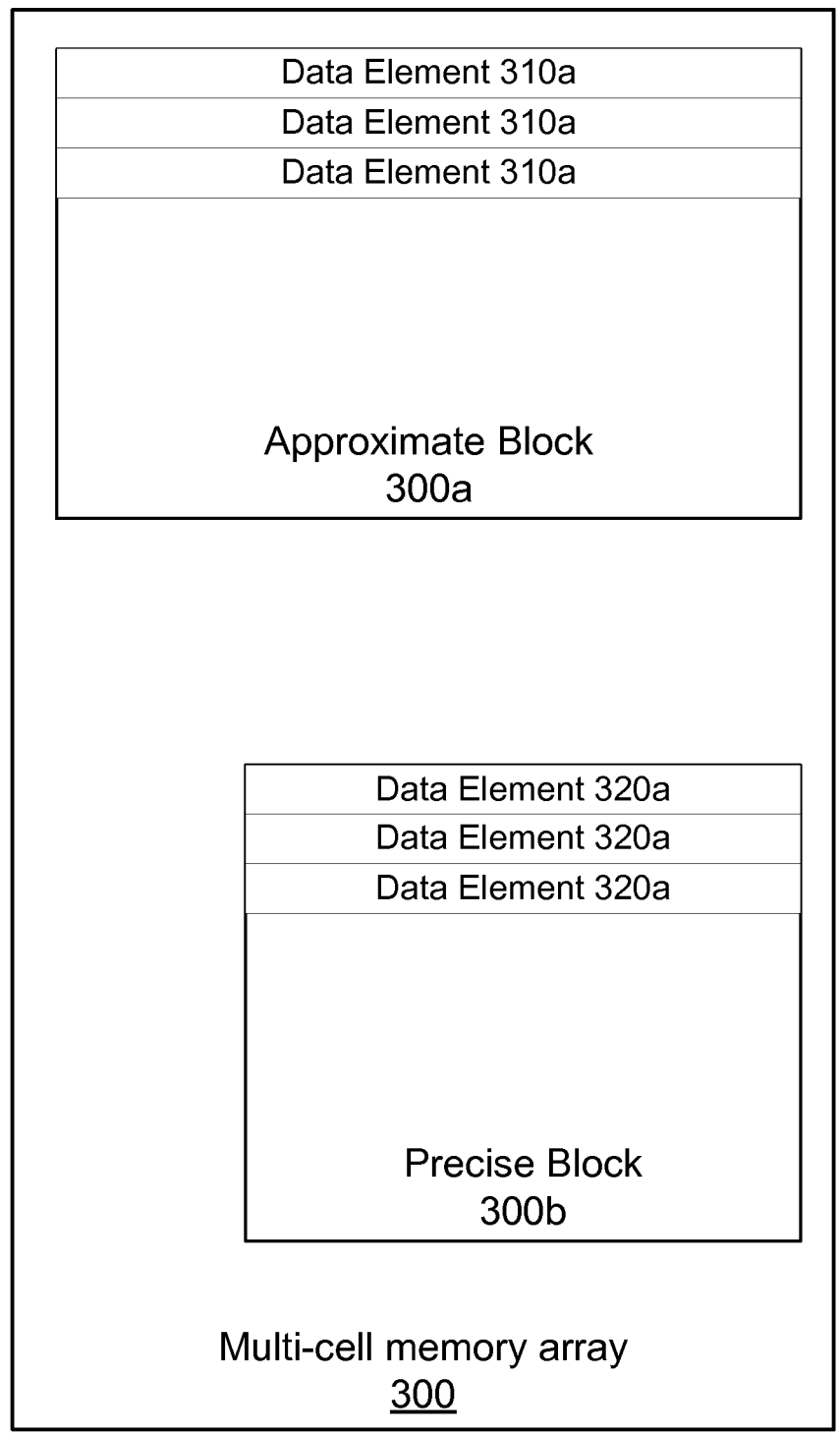
FIG. 3 illustrates a MLC memory having data stored as precise data and data stored as approximate data.

In an embodiment, an application uses the services of an operating system 106 and/or other supporting applications. For example, operating system 106 may include an allocator that is a software component that allocates and de-allocates portions of memory, such as MLC memory 101, to be used by application 107. In an embodiment, operating system 106 keeps track of which portions, or blocks of data, of MLC memory 101 include data stored as precise values and which include data stored as approximate values, as illustrated in FIG. 3.

In an embodiment, application 107 identifies which types of data are written and read as approximate data and which types of data are written and read as precise data. Application 107 may include language features (such as defined approximate variable structures), analyses, or program logics to identify and process approximate data values as well as precise data values in embodiments.

Controller 103 includes approximate memory operations 103a that is a software component that is executed by controller 103 in an embodiment. In an alternate embodiment, controller 103 outputs signals in response to processor 102 executing approximate memory operations 103a stored in memory 105. Signals are output from controller 103 in response to messages from processor 102 executing approximate memory operations 103a. Controller 103 outputs a signal that represents a digital data value to be stored as an approximate value and receives a signal that represents digital data stored as an approximate value. The received digital data stored as an approximate value represents an analog signal received from a MLC memory cell, of MLC memory 101 that was written as an approximate value in an embodiment. In an embodiment, controller 103 also outputs a signal that represents a digital data value to be stored as a precise value and receives a signal that represents a digital data value that has be written and read using full data-correctness-guarantees in an embodiment.

In an embodiment, controller executes approximate memory operations 103a in response to processor executing application 107 and/or operating system 106.

In an embodiment, controller 103 outputs and receives data as approximate values and data as precise values in a block (or page of data), such as a 512-bit block. FIG. 3 illustrates digital data stored as approximate values in approximate block 300a and digital data stored as precise values in precise block 300b of multi-cell array 300 in MLC memory 101.

In an embodiment, each block of memory in multi-cell array 300 includes either precise data values (precise block 300b) or approximate data values (approximate block 300a). In alternate embodiments, a first MLC memory array would store data as approximate values and a different MLC memory array would store data as precise values.

In an embodiment, a predetermined number of data values (or bits) (for example, in a "row") are simultaneously written in parallel as precise values. Alternatively, a predetermined number of data values are simultaneously written as approximate values. A row of memory cells (or other portion of MLC memory, such as bank) in a MLC memory may store either data values as precise values or approximate values.

In another embodiment, data values may be written into a portion of MLC memory (such as a row) simultaneously that includes data values stored as both precise and approximate values.

Each read and write request from controller 103 to MLC memory 101 specifies whether an access is approximate or precise in an embodiment. Controller 103 outputs flag information in control information of a write or read request that identifies whether a particular memory operation involves approximate data or precise data in an embodiment. The use of flag information allows MLC memory 101 to avoid the overhead of storing per-block metadata.

Alternatively, operating system 106 is responsible for keeping track of which memory locations or addresses in MLC memory array 300 hold data as approximate blocks and precise blocks. In an embodiment, an allocator of operating system 106 keeps track of the memory locations. Application 107 and/or operating system 106 may also convey the relative importance of bits within a block, enabling more significant bits to be stored with higher accuracy.

To specify the relative priority of bits within a block of memory, a memory operation request from controller 103 can also include a data element size, such as a size of data element 310a or data element 320a illustrated in FIG. 3. In an embodiment, a block of memory stores a homogenous array of values of this size in each data element with the highest-order bits being most important. For example, when application 107, via operating system 107 and controller 103, stores an array of double-precision floating point numbers in a block of memory, application 107 can specify a data element size of 8 bytes. MLC memory 101 will prioritize the precision of each number's sign bit and exponent over its mantissa in decreasing bit order. Bit priority helps MLC memory 101 and or controller 103 where to expend error protection resources to minimize the magnitude of errors when they occur.

In an embodiment, controller 103 also includes an error correction software component to correct errors. In an embodiment, one or more software components and/or circuits in controller 103 may be included in MLC memory 101. Alternatively, one or more software components and/or circuits in MLC memory 101 may be included in controller 103 in embodiments.

FIGS. 4A-4B illustrate probabilities and target ranges of analog values associated with storing data as precise values and approximate values. MLC memories store an analog value, a voltage value or resistance value, and quantize the analog value to provide a digital value that represents the measured analog value. In MLC Flash memory, the voltage value is the floating-gate transistor's stored charge, measured via its threshold voltage value. In MLC PCM memory a resistance is measured by applying a threshold voltage value that injects a current into the MLC memory.

Writes and reads to an analog substrate are typically imprecise. A write programming pulse, rather than adjusting the resistance or voltage by a precise amount, changes the MLC memory randomly according to a probability distribution, such a probability distribution 440. In an embodiment, probability distribution 440 is a normal or Gaussian distribution of possible analog values associated with cell values 00, 01, 10 and 11. In alternate embodiments, other types of probability distributions may be used. During reads, material non-determinism causes the recovered analog value to differ slightly from the analog value originally stored and, over time, the stored analog value can change due to drift. MLC memories that store data as a precise value are typically designed to minimize the likelihood that write imprecision, read noise, or drift cause storage errors in the digital domain. That is, given any digital value, a write followed by a read recovers the same digital value with very high probability. So as illustrated by FIGS. 4A-B, target ranges 400-403 that are used in storing data as precise values are much smaller that target ranges 420-423 used to store data as an approximate value. MLC memories that store data as approximate values would generally rather increase density or performance at the cost of occasional digital-domain storage errors.

MLC memories that store data as precise values incorporate guard bands, such as guard band 430, that account for this imprecision and attempt to prevent storage errors. These guard bands lead to tighter tolerances on target values, which in turn may limit write performance. Storing data as approximate values in MLC memories reduce or eliminate guard bands to improve write time at the cost of occasional errors.

FIG. 4B illustrates the target ranges of analog values (target range) 420-423 for an MLC memory that stores data as approximate values for four different cell values. As can be seen, target ranges 420-423 used to store data as approximate values as compared to target ranges 400-403 used to store data as precise values are substantially larger. Similarly, guard band 431 is substantially smaller than guard band 430. The target ranges for data stored as approximate values are so large, in an embodiment that a measured voltage $V_e$ may correspond to either a cell value 00 or 01. In comparison, guard band 430 does not allow for this duplicity to occur when storing data as precise values.

Figure 2:
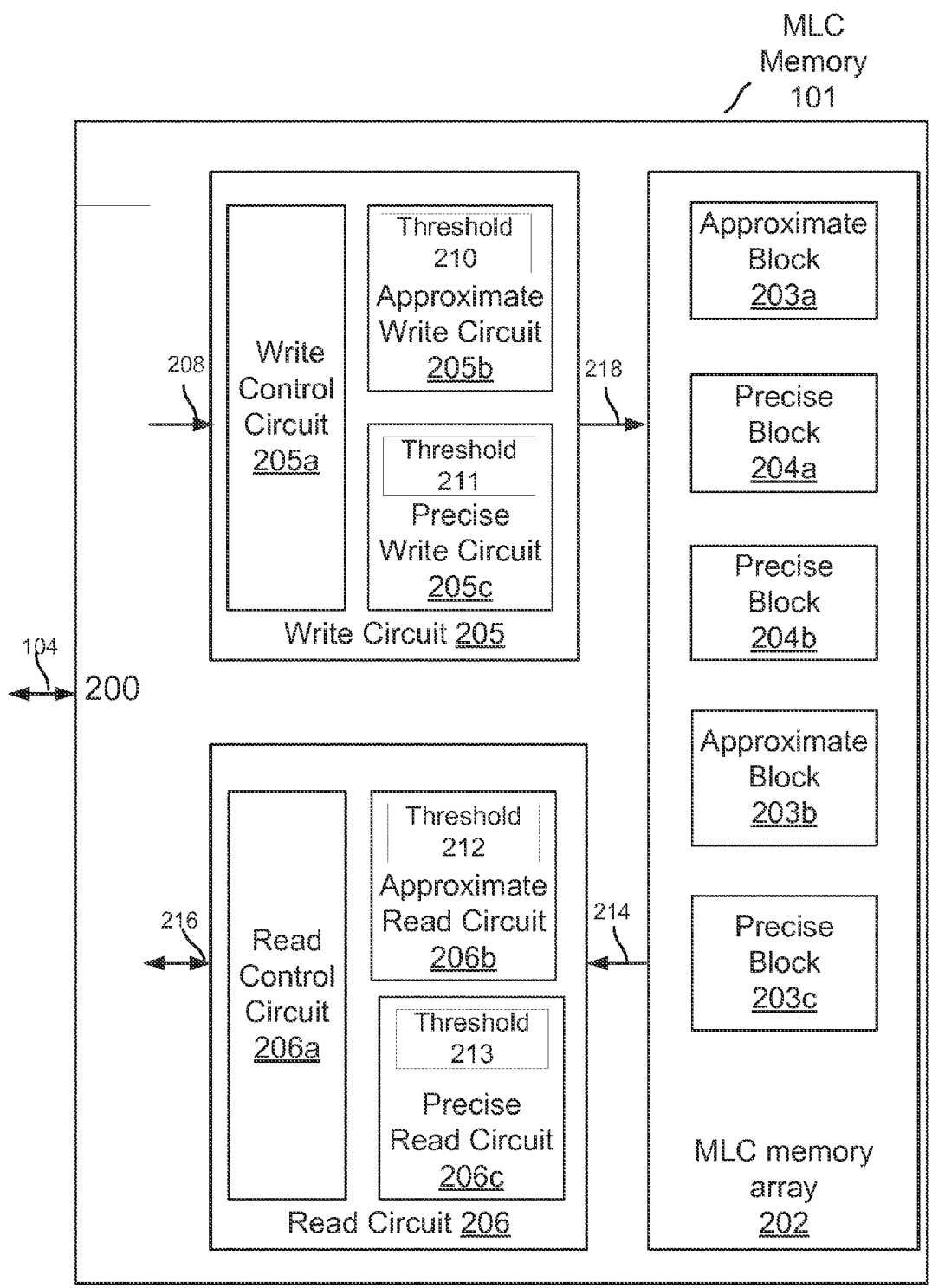
FIG. 2 illustrates a high-level block diagram of a MLC memory that performs approximate and precise memory operations.

FIG. 2 illustrates a high-level block diagram of a MLC memory 101 according to an embodiment. Data, timing and/or control information is transferred to MLC memory 101 from controller 103 on signal path 104 in embodiments. Signal path 104 may include multiple signal paths to carry multiple bits of information in parallel and/or serially. Signal path 104 may also provide timing or clock information to and from MLC memory 101. Timing or clock information may synchronize the reception and/or transfer of data from and to MLC memory 101.

The control information received by MLC memory 101 may include at least one command indicating a particular memory operation, address information and flag information indicating whether associated data to be accessed is approximate data or precise data in embodiments.

In an embodiment, the control information is provided in the form of a command packet that includes a command value or code representing a memory operation to perform and associated address information of MLC memory array 202. In an embodiment, a command packet also includes flag information that identifies whether the memory block accessed stores data as precise or approximate values. In an embodiment, control information is provided in successive fields or multi-bit positions in the command packet. In an embodiment, at least one processor executes application 107 that causes a command packet to be output from controller 103 to MLC memory 101. In alternate embodiments, command packets are not used and a bused and/or dedicated control signals are used.

Interface 200 is configured to receive and output signals representing control information, data stored as approximate and/or precise values, and/or timing information on signal path 104. In an embodiment, interface 200 includes metal contact or wire. In an embodiment, signals are transferred from interface 200 to write circuit 205 by way of signal path 208.

In an embodiment, write circuit 205 includes write control circuit 205a, approximate write circuit 205b, and precise write circuit 205c. In an embodiment, write control circuit 205a includes registers to receive control information or control signals, data and timing information in embodiments. Write control circuit 205a (as well as read control circuit 206a in embodiments) may include a phase lock loop (PLL) or delay lock loop (DLL) to time the reception and transfer of data and control information as well as time MLC memory 101 circuits. In embodiments, write control circuit 205a and read control circuit 206a includes serial-to-parallel converter circuits and/or parallel-to-serial converter circuits in embodiments.

Approximate write circuit 205b is responsible to store data as an approximate value in an embodiment. Approximate write circuit 205b stores an analog value at a particular address in MLC memory array 202 by providing an amount of energy iteratively via signal path 218 to iteratively change a state of an addressed cell. In an embodiment, the amount of energy used to program an approximate value is increased in approximate write circuit 205b as compared to an amount of energy used to program a cell by precise write circuit 205c so that less programming iterations are used as illustrated by FIG. 5B. In an alternate embodiment, less write iterations are used because a larger target range, such as approximate target range 420, is used as illustrated by FIG. 5C.

In particular, approximate write circuit 205b provides a programming pulse (P1,P2 in FIG. 5B or P1,P2,P3,P4 in FIG. 5C) and then verifies or senses an analog value stored at a cell of MCL array 202 after each iterative programming pulse is applied. The programming and verifying (measuring or sensing) is repeated over a plurality of iterative steps until the analog value stored at the address of the MLC memory is greater than or equal to a threshold 210, such as threshold voltage 520a. A programming pulse may have a predetermined voltage and duration. For example, programming pulse P2 has an amplitude $V_a$ and duration 530 as seen in FIG. 5B or a shorter duration, such as duration 510 for programming pulse P2.

The number of programming iterations (or pulses) used by approximate write circuit 205b is less than is used in precise write circuit 205c in embodiments as described herein. For example by comparison, FIG. 5A illustrates providing a plurality of predetermined values in writing a cell value that is stored as a precise value. In particular, a plurality of programming pulses P1-P5, each having a particular analog amplitude $V_a$ (voltage) and duration 510 is iteratively applied and verified (measured or sensed) until the sensed cell value has an analog value that falls within a precise target range 500 of analog values. Distribution 501 illustrates a normal or Gaussian distribution of analog values corresponding to a particular digital value similar to distribution 440 shown in FIGS. 4A-B. Precise target range 500 is selected such there is high probability that the programming will result in a data value stored correctly. In an embodiment, threshold value 500a at an end of precise target range 500 is used to compare to a sensed cell analog value and determine that the cell value has been stored correctly. Because precise target range 500 is smaller than approximate target range 520 (or not as wide) for a particular cell value, threshold values associated with writing values as precise values are less than threshold values used to write data as an approximate value.

In an embodiment, approximate write circuit 205b stores a block of data in MLC memory array 202, such as approximate blocks 203a and 203b, via signal path 218. As described herein, approximate write circuit 205b uses at least one threshold 210, such as a threshold voltage value or threshold resistance value, to store data as an approximate value in a MLC memory. In an embodiment, multiple thresholds (corresponding to different target ranges of analog values) are used for different cell values at different levels of a MLC memory in MLC memory array 202.

Precise write circuit 205c is responsible to store data as precise values in an embodiment. Precise write circuit 205c stores a value at a particular address in MLC memory array 202 by providing programming pulses iteratively via signal path 218 illustrated by FIG. 5A. In particular, precise write circuit 205c provides a programming pulse and then verifies (or senses) an analog value stored at a level of a MCL after the programming pulse is applied. The programming and verifying is repeated over a plurality of iterative steps until the value stored at the address is greater than or equal to a threshold 211. MLC Flash memory is typically written using a series of many small programming pulses whose amplitude and duration are chosen to minimize the probability of over-programming. A programming pulse used in precise write circuit 205c may have a predetermined voltage and duration that is less than the programming pulse used by approximate write circuit 205b.

In an embodiment, precise write circuit 205c stores a block of data in MLC memory array 202, such as precise blocks 204a, 204b and 204c. As described herein, precise write circuit 205c uses at least one threshold 211, such as a threshold voltage value or threshold resistance value, to store data as a precise value in a MLC memory of a corresponding block of data. In an embodiment, multiple thresholds (corresponding to different target ranges of analog values as illustrated in FIGS. 4A-B) are used for different cell values in MLC memory array 202. In an embodiment, threshold value 211 is selected such that full data-correctness-guarantees are met in storing a value in a MLC memory.

In an embodiment, approximate write circuit 205b and precise write circuit 205c may be combined.

In an embodiment, approximate write operations allow for denser cells under fixed energy and/or performance budgets.

In an embodiment, read circuit 206 includes read control circuit 206a, approximate read circuit 206b, and precise read circuit 206c. In an alternate embodiment, read circuit 206 does not include approximate read circuit 206b and reads data as a precise value. Approximate read circuit 205c is responsible to read data as an approximate value in an embodiment. Approximate read circuit 206b reads a value at a particular address in MLC memory array 202 in response to control signal received at signal path 216 via interface 200 and outputs the data as an approximate data to controller 103 via signal paths 216, interface 200 and signal path 104.

In an embodiment, approximate read circuit 206b reads a block of data in multi-cell array 202, such as approximate blocks 203a and 203b, via signal path 214. In alternate embodiments, approximate read circuit 206b may read precise blocks as well as approximate blocks. As described herein, approximate read circuit 205c uses at least one threshold value 212, such as a threshold voltage value or threshold resistance value, to read data as approximate data in a MLC memory. In an embodiment, multiple thresholds (corresponding to different target ranges of analog values) are used for different cell values at different levels of a MLC memory in multi-cell array 202. In an embodiment, read operations are made lower-energy by using read or pulse iterations to determine the rough vicinity of a value being read, or up to approximate target range 520.

In an embodiment, precise read circuit 206c reads a block of data in MLC memory array 202, such as precise blocks 204a, 204b and 204c, via signal path 214. As described herein, precise read circuit 206c uses at least one threshold value 213, such as a threshold voltage value or threshold resistance value, to read data as a precise value in a MLC memory of a corresponding block of data. In an embodiment, multiple thresholds (corresponding to different target ranges of analog values) are used for different cell values at different levels of a MLC memory in MLC memory array 202. In an embodiment, threshold value 213 is selected as having a higher value for a particular level (corresponding to smaller target range of analog values as illustrated in FIGS. 4A-B) than threshold value 212. In an embodiment, threshold value 212 is selected such that full data-correctness-guarantees are met in reading a value in a MLC memory.

In an embodiment, instead of returning an exact value read, approximate read circuit 206b returns data whose value is probabilistic following a pre-profiled distribution. For example, if a value read falls in an overlap area, such as voltage $V_e$ shown in FIG. 4B, then the data may possibly correspond to one of two values with a certain distribution. Approximate read circuit 206b returns one or the other two values probabilistically according to a relative density of each value's probability distribution. In an embodiment, approximate read circuit 206b includes a look-up table having corresponding probability distributions for pairs of cell values that may be used to output one of the possible values. In an alternate embodiment, approximate read circuit 206b may have a software component that performs a statistical analysis on possible values.

Figure 6A:
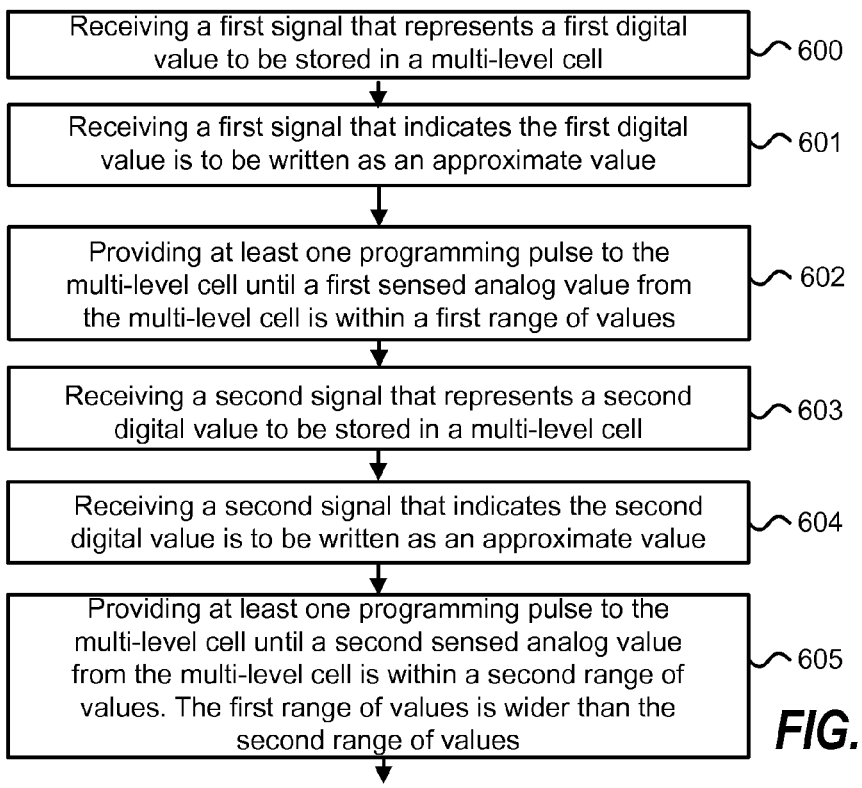
FIGS. 6A-C are flow charts for writing and reading values stored as approximate data and precise data.
Figure 6B:
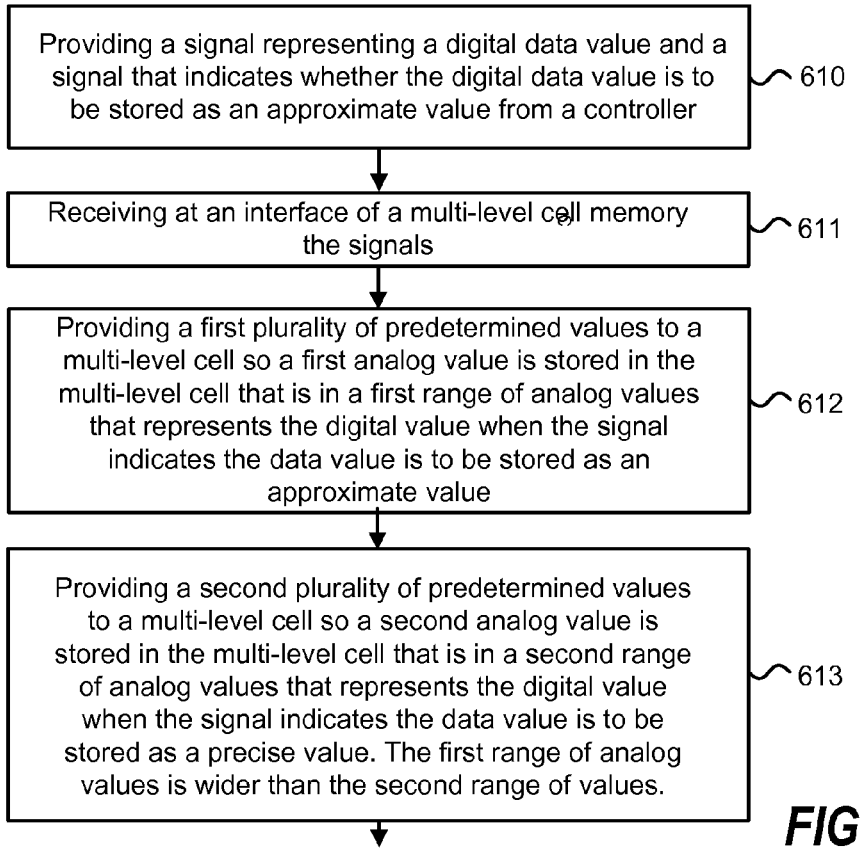
Figure 6C:
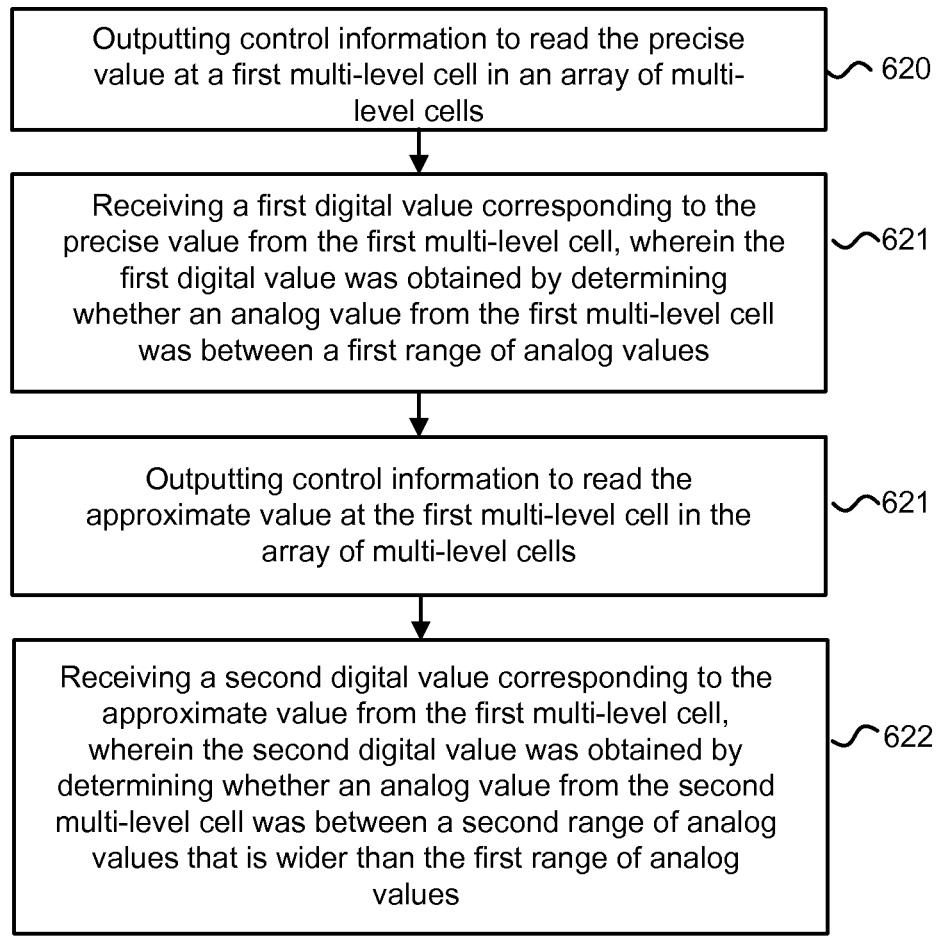

FIGS. 6A-C are flow charts for writing and reading approximate values in a MLC memory in various embodiments. In embodiments, steps illustrated in FIGS. 6A-C represent the operation of hardware (e.g., processors, memories, cells, circuits), software (e.g., operating systems, software components, applications, drivers, machine/processor executable instructions), or a user, singly or in combinations. As one of ordinary skill in the art would understand, embodiments may include less or more steps shown. In various embodiments, steps illustrated may be completed sequentially, in parallel or in a different order as illustrated.

In an embodiment, a method illustrated by FIG. 6A illustrates an operation of a MLC memory, such a MLC memory 101. Step 600 illustrates receiving a first signal that represents a first digital value to be stored in a multi-level cell. In an embodiment, at least interface 200 and/or write control circuit 205a performs this step.

Step 601 represents receiving a first signal that indicates a first digital value is to be written as an approximate value. In an embodiment, at least interface 200 and/or write control circuit 205a performs this step.

Step 602 represents providing at least one programming pulse to the multi-level cell until a first sensed analog value from the multi-level cell is within a first range of values. In an embodiment, approximate write circuit 205b performs this step.

Step 603 represents receiving a second signal that represents a second digital value to be stored in a multi-level cell. In an embodiment, at least interface 200 and/or write control circuit 205a performs this step.

Step 604 represents receiving a second signal that indicates the second digital value is to be written as a precise value. In an embodiment, at least interface 200 and/or write control circuit 205a performs this step. Step 604 represents providing at least one programming pulse to the multi-level cell until a second sensed analog value from the multi-level cell is within a second range of values. The first range of values is wider than the second range of values. In an embodiment, precise write circuit 205c performs this step.

In an embodiment, a method illustrated by FIG. 6B illustrates an operation of a computing device, such a computing device 100. Step 610 represents providing a signal representing a digital data value and a signal that indicates whether the digital data value is to be stored as an approximate value from a controller. In an embodiment, controller 103 executing approximate memory operations 103a performs this step.

Step 611 illustrates receiving at an interface of a multi-level cell memory the signals. In an embodiment, MLC memory 101 performs this step, and in particular at least interface 200 and/or write control circuit 205a of MLC memory 101.

Step 612 illustrates providing a first plurality of predetermined values (such as first plurality of pulses) to a multi-level cell so a first analog value is stored in the multi-level cell. The first analog value is in a first range of analog values that represents the digital value when the signal indicates the data value is to be stored as an approximate value. In an embodiment, MLC memory 101 performs this step, and in particular, at least approximate write circuit 205b of MLC memory 101.

Step 613 illustrates providing a second plurality of predetermined values (such as a second plurality of pulses) to a multi-level cell so a second analog value is stored in the multi-level cell. The second analog value is in a second range of analog values that represents the digital value when the signal indicates the data value is to be stored as a precise value. The first range of analog values is wider than the second range of values. In an embodiment, MLC memory 101 performs this step, and in particular, at least approximate write circuit 205b of MLC memory 101.

In an embodiment, a method illustrated by FIG. 6C illustrates an operation of a controller, such controller 103 executing approximate memory operations 103a. Step 620 represents outputting control information to read a precise value at a first multi-level cell in an array of multi-level cells. In an embodiment, controller 103 outputs the control information to MLC memory 101.

Step 621 illustrates receiving a first digital value corresponding to the precise value from a first multi-level cell. The first digital value was obtained by determining whether an analog value from the first multi-level cell was between a first range of analog values. In an embodiment, controller 103 receives the first digital value.

Step 623 illustrates outputting control information to read the approximate value at the first multi-level cell in the array of multi-level cells. In an embodiment, controller 103 outputs the control information to MLC memory 101.

Step 624 illustrates receiving a second digital value corresponding to the approximate value from the first multi-level cell. The second digital value was obtained by determining whether an analog value from the second multi-level cell was between a second range of analog values. The second range of analog values is wider than the first range of analog values. In an embodiment, controller 103 receives the second digital value.

These methods may include other steps, actions and/or details that are not discussed in these method overviews illustrated in FIGS. 6a-C. Other steps, actions and/or details are discussed with reference to other figures and may be a part of the methods, depending on the implementation.

In an embodiment, computing device 100 may be, but is not limited to, a video game and/or media console. FIG. 7 will now be used to describe an exemplary video game and media console, or more generally, will be used to describe an exemplary gaming and media system 1000 that includes a game and media console. The following discussion of FIG. 7 is intended to provide a brief, general description of a suitable computing device with which concepts presented herein may be implemented. It is understood that the system of FIG. 7 is by way of example only. In further examples, embodiments describe herein may be implemented using a variety of client computing devices, either via a browser application or a software application resident on and executed by a client computing device. As shown in FIG. 7, a gaming and media system 1000 includes a game and media console (hereinafter "console") 1002. In general, the console 1002 is one type of client computing device. The console 1002 is configured to accommodate one or more wireless controllers, as represented by controllers $1004_1$ and $1004_2$. The console 1002 is equipped with an internal hard disk drive and a portable media drive 1006 that support various forms of portable storage media, as represented by an optical storage disc 1008. Examples of suitable portable storage media include DVD, CD-ROM, game discs, and so forth. The console 1002 also includes two memory unit card receptacles $1025_1$ and $1025_2$, for receiving removable flash-type memory units 1040. A command button 1035 on the console 1002 enables and disables wireless peripheral support.

As depicted in FIG. 7, the console 1002 also includes an optical port 1030 for communicating wirelessly with one or more devices and two USB ports $1010_1$ and $1010_2$ to support a wired connection for additional controllers, or other peripherals. In some implementations, the number and arrangement of additional ports may be modified. A power button 1012 and an eject button 1014 are also positioned on the front face of the console 1002. The power button 1012 is selected to apply power to the game console, and can also provide access to other features and controls, and the eject button 1014 alternately opens and closes the tray of a portable media drive 1006 to enable insertion and extraction of an optical storage disc 1008.

The console 1002 connects to a television or other display (such as display 1050) via A/V interfacing cables 1020. In one implementation, the console 1002 is equipped with a dedicated A/V port configured for content-secured digital communication using A/V cables 1020 (e.g., A/V cables suitable for coupling to a High Definition Multimedia Interface "HDMI" port on a high definition display 1050 or other display device). A power cable 1022 provides power to the game console. The console 1002 may be further configured with broadband capabilities, as represented by a cable or modem connector 1024 to facilitate access to a network, such as the Internet. The broadband capabilities can also be provided wirelessly, through a broadband network such as a wireless fidelity (Wi-Fi) network.

Each controller 1004 is coupled to the console 1002 via a wired or wireless interface. In the illustrated implementation, the controllers 1004 are USB-compatible and are coupled to the console 1002 via a wireless or USB port 1010. The console 1002 may be equipped with any of a wide variety of user interaction mechanisms. In an example illustrated in FIG. 7, each controller 1004 is equipped with two thumb sticks $1032_1$ and $1032_2$, a D-pad 1034, buttons 1036, and two triggers 1038. These controllers are merely representative, and other known gaming controllers may be substituted for, or added to, those shown in FIG. 7.

In an embodiment, a user may enter input to console 1002 by way of gesture, touch or voice. In an embodiment, optical I/O interface 1135 receives and translates gestures of a user. In another embodiment, console 1002 includes a natural user interface (NUI) to receive and translate voice and gesture inputs from a user. In an alternate embodiment, front panel subassembly 1142 includes a touch surface and a microphone for receiving and translating a touch or voice, such as a voice command, of a user.

In one implementation, a memory unit (MU) 1040 may also be inserted into the controller 1004 to provide additional and portable storage. Portable MUs enable users to store game parameters for use when playing on other consoles. In this implementation, each controller is configured to accommodate two MUs 1040, although more or less than two MUs may also be employed.

The gaming and media system 1000 is generally configured for playing games (such as video games) stored on a memory medium, as well as for downloading and playing games, and reproducing pre-recorded music and videos, from both electronic and hard media sources. With the different storage offerings, titles can be played from the hard disk drive, from an optical storage disc (e.g., 1008), from an online source, or from MU 1040. Samples of the types of media that gaming and media system 1000 is capable of playing include:

Game titles played from CD and DVD discs, from the hard disk drive, or from an online streaming media source.

Digital music played from a CD in portable media drive 1006, from a file on the hard disk drive (e.g., music in a media format), or from online streaming media sources.

Digital audio/video played from a DVD disc in portable media drive 1006, from a file on the hard disk drive (e.g., Active Streaming Format), or from online streaming sources.

During operation, the console 1002 is configured to receive input from controllers 1004 and display information on the display 1050. For example, the console 1002 can display a user interface on the display 1050 to allow a user to select a game using the controller 1004 and display state solvability information as discussed below.

FIG. 8 is a functional block diagram of the gaming and media system 1000 and shows functional components of the gaming and media system 1000 in more detail. The console 1002 has a CPU 1100, and a memory controller 1102 that facilitates processor access to various types of memory, including a flash ROM 1104, a RAM 1106, a hard disk drive 1108, and the portable media drive 1006. In one implementation, the CPU 1100 includes a level 1 cache 1110 and a level 2 cache 1112, to temporarily store data and hence reduce the number of memory access cycles made to the hard drive 1108, thereby improving processing speed and throughput.

The CPU 1100, the memory controller 1102, and various memory devices are interconnected via one or more buses. The details of the bus that is used in this implementation are not particularly relevant to understanding the subject matter of interest being discussed herein. However, it will be understood that such a bus might include one or more of serial and parallel buses, a memory bus, a peripheral bus, and a processor or local bus, using any of a variety of bus architectures. By way of example, such architectures can include an Industry Standard Architecture (ISA) bus, a Micro Channel Architecture (MCA) bus, an Enhanced ISA (EISA) bus, a Video Electronics Standards Association (VESA) local bus, and a Peripheral Component Interconnects (PCI) bus also known as a Mezzanine bus.

In one implementation, the CPU 1100, the memory controller 1102, the ROM 1104, and the RAM 1106 are integrated onto a common module 1114. In this implementation, the ROM 1104 is configured as a flash ROM that is connected to the memory controller 1102 via a PCI bus and a ROM bus (neither of which are shown). The RAM 1106 is configured as multiple Double Data Rate Synchronous Dynamic RAM (DDR SDRAM) modules that are independently controlled by the memory controller 1102 via separate buses. The hard disk drive 1108 and the portable media drive 1006 are shown connected to the memory controller 1102 via the PCI bus and an AT Attachment (ATA) bus 1116. However, in other implementations, dedicated data bus structures of different types can also be applied in the alternative.

In an embodiment, RAM 1106 may represent one or more processor readable memories. In an embodiment, RAM 1106 may be a Wide I/O DRAM. Alternatively, memory 402 may be Low Power Double Data Rate 3 dynamic random access memory (LPDDR3 DRAM) memory (also known as Low Power DDR, mobile DDR (MDDR) or mDDR). In an embodiment, memory 402 may be a combination of different types of memory.

In embodiments, RAM 1106 includes one or more arrays of memory cells in an IC disposed on a semiconductor substrate. In an embodiment, RAM 1106 is included in an integrated monolithic circuit housed in a separately packaged device than CPU 1100.

RAM 1106 may be replaced with other types of volatile memory that include at least dynamic random access memory (DRAM), molecular charge-based (ZettaCore) DRAM, floating-body DRAM and static random access memory ("SRAM"). Particular types of DRAM include double data rate SDRAM ("DDR"), or later generation SDRAM (e.g., "DDRn").

ROM 1104 may likewise be replaced with other types of non-volatile memory including at least types of electrically erasable program read-only memory ("EEPROM"), FLASH (including NAND and NOR FLASH), ONO FLASH, magneto resistive or magnetic RAM ("MRAM"), ferroelectric RAM ("FRAM"), holographic media, Ovonic/phase change, Nano crystals, Nanotube RAM (NRAM-Nantero), MEMS scanning probe systems, MEMS cantilever switch, polymer, molecular, nano-floating gate and single electron.

In an embodiment, ROM 1104 and RAM 1106 are replaced by MLC memory 101 storing application 107 and operating system 106. Similarly, memory controller 1102 and CPU 1100 are replaced by controller 103 and processor 102 as illustrated in FIG. 1.

A three-dimensional graphics processing unit 1120 and a video encoder 1122 form a video processing pipeline for high speed and high resolution (e.g., High Definition) graphics processing. Data are carried from the graphics processing unit 1120 to the video encoder 1122 via a digital video bus. An audio processing unit 1124 and an audio codec (coder/decoder) 1126 form a corresponding audio processing pipeline for multi-channel audio processing of various digital audio formats. Audio data are carried between the audio processing unit 1124 and the audio codec 1126 via a communication link. The video and audio processing pipelines output data to an A/V (audio/video) port 1128 for transmission to a television or other display. In the illustrated implementation, the video and audio processing components 1120-1128 are mounted on the module 1114.

FIG. 8 shows the module 1114 including a USB host controller 1130 and a network interface 1132. The USB host controller 1130 is shown in communication with the CPU 1100 and the memory controller 1102 via a bus (e.g., PCI bus) and serves as host for the peripheral controllers $1004_1$-$1004_4$. The network interface 1132 provides access to a network (e.g., Internet, home network, etc.) and may be any of a wide variety of various wire or wireless interface components including an Ethernet card, a modem, a wireless access card, a Bluetooth module, a cable modem, and the like.

In the implementation depicted in FIG. 8, the console 1002 includes a controller support subassembly 1140 for supporting the four controllers $1004_1$-$1004_4$. The controller support subassembly 1140 includes any hardware and software components to support wired and wireless operation with an external control device, such as for example, a media and game controller. A front panel I/O subassembly 1142 supports the multiple functionalities of power button 1012, the eject button 1014, as well as any LEDs (light emitting diodes) or other indicators exposed on the outer surface of console 1002. Subassemblies 1140 and 1142 are in communication with the module 1114 via one or more cable assemblies 1144. In other implementations, the console 1002 can include additional controller subassemblies. The illustrated implementation also shows an optical I/O interface 1135 that is configured to send and receive signals that can be communicated to the module 1114.

The MUs $1040_1$ and $1040_2$ are illustrated as being connectable to MU ports "A" $1030_1$ and "B" $1030_2$ respectively. Additional MUs (e.g., MUs $1040_3$-$1040_6$) are illustrated as being connectable to the controllers $1004_1$ and $1004_3$, i.e., two MUs for each controller. The controllers $1004_2$ and $1004_4$ can also be configured to receive MUs. Each MU 1040 offers additional storage on which games, game parameters, and other data may be stored. In some implementations, the other data can include any of a digital game component, an executable gaming application, an instruction set for expanding a gaming application, and a media file. When inserted into the console 1002 or a controller, the memory controller 1102 can access the MU 1040.

A system power supply module 1150 provides power to the components of the gaming system 1000. A fan 1152 cools the circuitry within the console 1002.

An application 1160 comprising processor readable instructions is stored on the hard disk drive 1108. When the console 1002 is powered on, various portions of the application 1160 are loaded into RAM 1106, and/or caches 1110 and 1112, for execution on the CPU 1100, wherein the application 1160 is one such example. Various applications can be stored on the hard disk drive 1108 for execution on CPU 1100.

The console 1002 is also shown as including a communication subsystem 1170 configured to communicatively couple the console 1002 with one or more other computing devices (e.g., other consoles). The communication subsystem 1170 may include wired and/or wireless communication devices compatible with one or more different communication protocols. As non-limiting examples, the communication subsystem 1170 may be configured for communication via a wireless telephone network, or a wired or wireless local- or wide-area network. In some embodiments, the communication subsystem 1170 may allow the console 1002 to send and/or receive messages to and/or from other devices via a network such as the Internet. In specific embodiments, the communication subsystem 1170 can be used to communicate with a coordinator and/or other computing devices, for sending download requests, and for effecting downloading and uploading of digital content. More generally, the communication subsystem 1170 can enable the console 1002 to participate on peer-to-peer communications.

The gaming and media system 1000 may be operated as a standalone system by simply connecting the system to display 1050 (FIG. 7), a television, a video projector, or other display device. In this standalone mode, the gaming and media system 1000 enables one or more players to play games, or enjoy digital media, e.g., by watching movies, or listening to music. However, with the integration of broadband connectivity made available through network interface 1132, or more generally the communication subsystem 1170, the gaming and media system 1000 may further be operated as a participant in a larger network gaming community, such as a peer-to-peer network.

The above described console 1002 is just one example of the computing device 100 discussed above with reference to FIG. 1 and various other Figures. As was explained above, there are various other types of computing devices with which embodiments described herein can be used.

Figure 9:
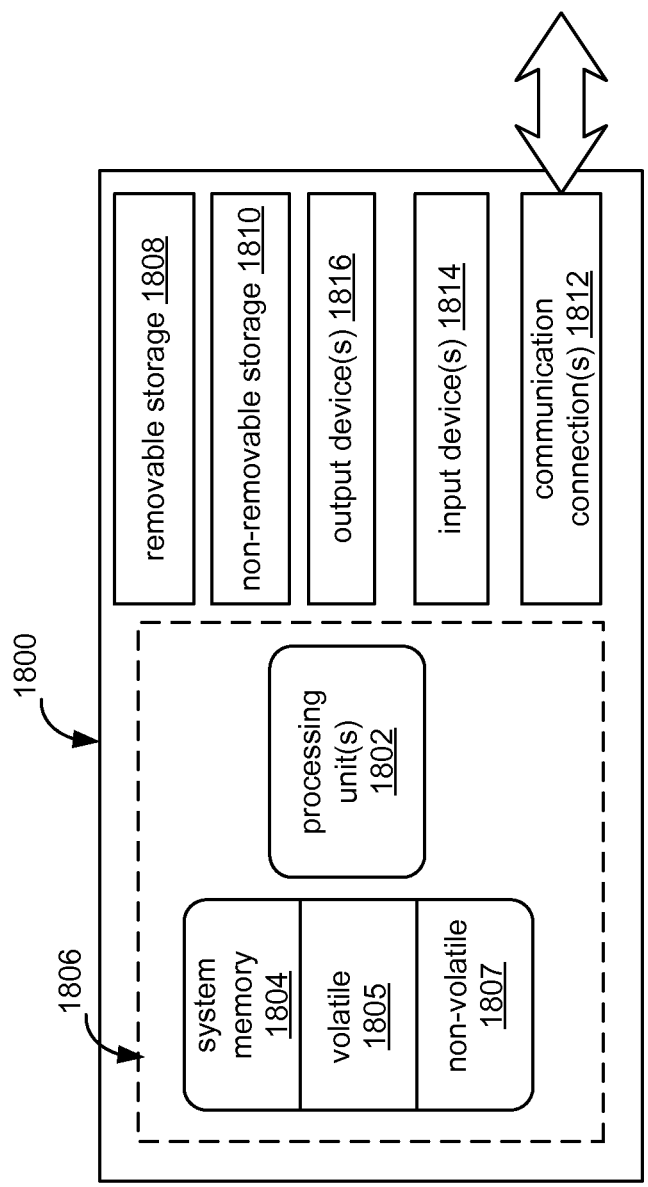
FIG. 9 illustrates is a block diagram of one embodiment of a network accessible computing device.

FIG. 9 is a block diagram of one embodiment of a computing device 100 which may host at least some of the software components illustrated in FIG. 1. In its most basic configuration, computing device 1800 typically includes one or more processing units 1802 including one or more CPUs and one or more GPUs. Depending on the exact configuration and type of computing device, system memory 1804 may include volatile memory 1805 (such as RAM), non-volatile memory 1807 (such as ROM, flash memory, etc.) or some combination of the two. Computing device 1800 also includes system memory 1804 that may be replaced by MLC memory 101 as illustrated in FIG. 1. This most basic configuration is illustrated in FIG. 9 by dashed line 1806. Additionally, device 1800 may also have additional features/functionality. For example, device 1800 may also include additional storage (removable and/or non-removable) including, but not limited to, magnetic or optical discs or tape. Such additional storage is illustrated in FIG. 9 by removable storage 1808 and non-removable storage 1810.

Device 1800 may also contain communications connection(s) 1812 such as one or more network interfaces and transceivers that allow the device to communicate with other devices. Device 1800 may also have input device(s) 1814 such as keyboard, mouse, pen, voice input device, touch input device, gesture input device, etc. Output device(s) 1816 such as a display, speakers, printer, etc. may also be included. These devices are well known in the art so they are not discussed at length here.

In an embodiment, device 1800 is a cellular telephone that executes an application 107, such as an application that analyzes and/or receives sensor data, including for example, global positioning system (GPS) sensor data and/or accelerometer data from sensors positioned on the cellular telephone. In an embodiment, such sensor data may be stored as approximate data.

The foregoing detailed description of the inventive system has been presented for purposes of illustration and description. It is not intended to be exhaustive or to limit the inventive system to the precise form disclosed. Many modifications and variations are possible in light of the above teaching. The described embodiments were chosen in order to best explain the principles of the inventive system and its practical application to thereby enable others skilled in the art to best utilize the inventive system in various embodiments and with various modifications as are suited to the particular use contemplated. It is intended that the scope of the inventive system be defined by the claims appended hereto.

What is claimed is:

1. A device, comprising:
   a controller for providing a digital data value; and
   a multi-level cell memory including
      an array of multi-level cells, each multi-level cell in the array being configured to utilize a respective probability distribution of likely analog values to represent a stored digital data value, and
      one or more write circuits configured for storing the digital data value as an approximate analog value having relaxed precision by writing to a multi-level cell in the array using analog values within a first target range that overlaps the probability distributions associated with adjacent digital data values stored in multi-level cells in the array.

2. The device of claim 1 in which each multi-level cell in the array is adapted for storing at least two digital data values.

3. The device of claim 1 in which each multi-level cell in the array is selected from one of a multi-level flash memory or a multi-level phase change memory.

4. The device of claim 1 in which the controller further sets a flag that indicates when the digital data value is to be stored as a precise analog value and when the digital data value is to be stored as an approximate analog value.

5. The device of claim 4 in which the one or more write circuits are further configured to store the digital data value as a precise analog value responsively to the flag by writing to a multi-level cell using analog values within a second target range that does not overlap the probability distributions associated with digital data values stored in adjacent multi-level cells in the array.

6. The device of claim 5 in which the first target range of analog values is narrower than the second target range of analog values and, when the digital data value is stored as a precise analog value, the multi-level cell memory incorporates guard bands.

7. The device of claim 6 in which the first target range of analog values includes a first plurality of programming pulses having a first voltage value, the second target range of analog values includes a second plurality of programming voltages having a second voltage value, and the first voltage value is greater than the second voltage value.

8. The device of claim 6 in which the first target range of analog values includes a first plurality of programming pulses having a first duration, the second target range of analog values includes a second plurality of programming voltages having a second duration, and the first duration is greater than the second duration.

9. The device of claim 1 in which the one or more write circuits are further configured to provide at least one programming pulse to the multi-level cell until a sensed analog value from the multi-level cell is within the first target range of analog values or the sensed analog value is within the second target range of analog values.

10. The device of claim 9 in which the sensed analog value is one of a voltage value or a resistance value.

11. A method for reading a digital data value as an approximate value from an array of multi-level cells, the method comprising:
    receiving control information at a read control circuit to read the digital data value at an address in the array;
    performing a read operation on a block of data at the address in the array to obtain an analog value representing one of two possible digital data values, each of the two possible digital data values being represented by analog values falling within an associated pre-profiled probability distribution;
    selecting one of the two possible digital data values based on a density of each digital data value's probability distribution; and
    returning the selected digital data value to the read control circuit responsively to the received control information so that the read circuit reads the digital data as an approximate value having relaxed precision without full data-correctness.

12. The method of claim 11 further including performing a look up of the pre-profiled probability distributions associated with the two possible digital data values in a look up table.

13. The method of claim 11 further including performing a statistical analysis on the two possible digital data values when performing the selecting.

14. The method of claim 11 further including receiving control information to read a digital data value as a precise value at an address in the array of multi-level cells, performing a read operation on a block of data at the address in the multi-level cell array to obtain an analog value, and determining if the analog value exceeds a threshold at which a full data-correctness-guarantee is obtained.

15. A multi-level cell memory arranged for storing a digital data value as an approximate value having relaxed precision, comprising:
    an interface to a controller;
    a plurality of multi-level cells configured as an array; and
    a write control circuit adapted for
       receiving, from the controller over the interface, a digital data value to be stored in a portion of the array;
       receiving, from the controller over the interface, an indication that the digital data value is to be written as the approximate value having relaxed precision;
       responsively to the indication, writing the digital data value as an approximate value by iteratively providing one or more programming pulses to the multi-level cell array until a sensed analog value falls within a first target range of analog values, the first target range of analog values being wider than a second target range of analog values utilized when the digital data value is written as a precise value with full data-correctness.

16. The multi-level cell memory of claim 15 further comprising a read control circuit adapted for determining if an analog value read from a multi-level cell falls within the first target range or second target range and for returning an approximate value when the read analog value falls within the first target range and returning a precise value when the read analog values falls within the second target range.

17. The multi-level cell memory of claim 16 in which the write control circuit is adapted for writing both an approximate value and a precise value into a single multi-level cell in the array.

18. The multi-level cell memory of claim 16 in which the write control circuit is adapted for providing programming pulses with greater amounts of energy when writing approximate values than when writing precise values.

19. The multi-level cell memory of claim 15 in which the write control circuit is further adapted for writing the digital data value as a precise value with full data-correctness by iteratively providing one or more programming pulses to the multi-level cell array until a sensed analog value falls within the second target range of analog values, the programming pulses for writing a precise value being shorter in duration, or having a lesser magnitude, or using more iterations than the programming pulses for writing an approximate value.

20. The multi-level cell memory of claim 15 in which the write control circuit comprises one of phased lock loop or delay lock loop adapted for performing timing of data and control information transfer and reception over the interface.

* * * * *